United States Patent
Lee et al.

(10) Patent No.: US 6,261,911 B1
(45) Date of Patent: Jul. 17, 2001

(54) METHOD OF MANUFACTURING A JUNCTION IN A SEMICONDUCTOR DEVICE

(75) Inventors: Jung Ho Lee, Seoul; Seung Chul Lee, Kyungki-do; Noh Yeal Kwak, Kyungki-do; In Seok Yeo, Kyungki-do; Sahng Kyoo Lee, Seoul, all of (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/502,782

(22) Filed: Feb. 11, 2000

(30) Foreign Application Priority Data

Feb. 13, 1999 (KR) .................................................. 99-5183

(51) Int. Cl.⁷ ................................................. H01L 21/336

(52) U.S. Cl. ............................................................. 438/300

(58) Field of Search ............................................ 438/300

(56) References Cited

U.S. PATENT DOCUMENTS

| | | |
|---|---|---|
| 4,728,623 | 3/1988 | Lu et al. . |
| 4,738,937 | 4/1988 | Parsons . |
| 4,918,029 | 4/1990 | Kim . |
| 5,004,702 | 4/1991 | Samata et al. . |
| 5,030,583 | 7/1991 | Beetz, Jr. . |

(List continued on next page.)

FOREIGN PATENT DOCUMENTS

| | | |
|---|---|---|
| 54-158880 | 12/1979 | (JP) . |
| 2-37745 | 2/1990 | (JP) . |
| 2-260667 | 10/1990 | (JP) . |
| 8-236728 | 9/1996 | (JP) . |
| 10-107219 | 4/1998 | (JP) . |
| 11-97519 | 4/1999 | (JP) . |

OTHER PUBLICATIONS

High Performance Buried Channel–pFETs Using Elevated Source/Drain Structure with Self–Aligned Epitaxial Silicon Sliver (SESS), Lee et al., Extended Abstracts of the 1999 International Conference on Solid State devices and Materials, 1999, pp. 38–39.

Low Resistance Co–Salicided 0.1 $\mu$m CMOS Technology Using Selective Si Growth, Sayama et al., Aug. 1999, 2 pages.

Suppression of Random Dopant–Induced Threshold Voltage Fluctuations in Sub–0,1–$\mu$m MOSFET's with Epitaxial and δ–Doped Channels, Asenov, IEEE Transactions on Electron Devices, vo. 40, No. 8, Aug. 1999, pp. 1718–1724 (N.B.—p. 1722 is missing).

Drivability Improvement on Deep–Submicron MOSFET's by Elevation of Source/Drain Regions, Yamakawa et al., IEEE Electron Device Letters, vol. 20, No. 7, Jul. 1999, pp. 366–368.

Channel Engineering Using B10h14 Ion Implantation for Low Vth and High SCE Immunity of Buried–Channel PMOSFETs in 4–Gbit DRAMs and Beyond, Tanaka et al., 1998, 2 pages.

(List continued on next page.)

*Primary Examiner*—John F. Niebling
*Assistant Examiner*—Lynn A. Gurley
(74) *Attorney, Agent, or Firm*—Pennie & Edmonds LLP

(57) ABSTRACT

The present invention relates to a method of manufacturing a junction in a semiconductor device. When forming an elevated source/drain junction (ESD) of a buried channel field effect transistor (BC-FET) using a selective epitaxial growth (SEG) technique, a self-aligned epitaxial silicon (SESS) is formed on the lower portion of a gate side-wall spacer, resulting in the improvement of a short channel characteristic by suppressing a facet occurred when forming an elevated source/drain junction (EDS) of the buried channel field effect transistors (BC-FETs) using a selective epitaxial growth (SEG) technique as well as the increase of the current density by lowering the series resistance of source/drain extension.

16 Claims, 5 Drawing Sheets

U.S. PATENT DOCUMENTS

| | | |
|---|---|---|
| 5,032,538 | 7/1991 | Bozler et al. . |
| 5,045,494 | 9/1991 | Choi et al. . |
| 5,272,109 | 12/1993 | Motoda . |
| 5,322,802 | 6/1994 | Baliga et al. . |
| 5,322,814 | 6/1994 | Rouse et al. . |
| 5,378,652 | 1/1995 | Samata et al. . |
| 5,432,121 | 7/1995 | Chan et al. . |
| 5,435,856 | 7/1995 | Rouse et al. . |
| 5,494,837 | 2/1996 | Subramanian et al. . |
| 5,508,225 | 4/1996 | Kadoiwa . |
| 5,567,652 | 10/1996 | Nishio . |
| 5,599,724 | 2/1997 | Yoshida . |
| 5,627,102 | 5/1997 | Shinriki et al. . |
| 5,633,201 | 5/1997 | Choi . |
| 5,744,377 | 4/1998 | Sekiguchi et al. . |
| 5,773,350 | 6/1998 | Herbert et al. . |
| 5,804,470 | 9/1998 | Wollesen . |
| 5,840,604 * | 11/1998 | Yoo et al. ............................. 438/300 |
| 5,970,351 * | 10/1999 | Takeuchi .............................. 438/300 |
| 5,998,248 * | 12/1999 | Ma et al. ............................. 438/300 |
| 5,998,273 * | 12/1999 | Ma et al. ............................. 438/300 |
| 6,022,771 * | 2/2000 | Ma et al. ............................. 438/300 |
| 6,025,242 * | 2/2000 | Ma et al. ............................. 438/300 |
| 6,117,741 * | 9/2000 | Chatterjee et al. ................... 438/300 |
| 6,127,232 * | 10/2000 | Chatterjee et al. ................... 438/300 |
| 6,156,613 * | 12/2000 | Wu ....................................... 438/300 |
| 6,177,323 * | 1/2001 | Wu ....................................... 438/300 |
| 6,190,977 * | 2/2001 | Wu ....................................... 438/300 |

OTHER PUBLICATIONS

Facet–Free Si Selective Epitaxial Growth Adaptable to Elevated Source/Drain MOSFETs with Narrow STI, Miyano et al., Extended Abstracts of the 1998 International Conference on Solid State Devices and Materials, 1998, pp. 420–421.

Strained Growth Behavior of Selective Silicon Epitaxy in Confined Structures, Lee et al. Journal of the Korean Physical Society, vol. 33, Nov. 1998, pp. S302–S304.

Impact of Epi Facets on Deep Submicron Elevated Source/Drain MOSFET Characteristics, Sun et al., IEEE Transactions on Electron Devices, vol. 45, No. 5, Jun. 1998, pp. 1377–1380.

A 0.1–$\mu$m Delta–Doped MOSFET Fabricated with Post–Low–Energy Implanted Selective Epitaxy, Noda et al., IEEE Transactions on Electron Devices, vol. 45, No. 4, Apr. 1998, pp. 809–814.

0.15– m Buried–Channel p–MOSFET's with Ultrathin Boron–Doped Epitaxial Si Layer, Ohguro et al., IEEE Transactions on Electron Devices, vol. 45, No. 35, Mar. 1998, pp. 717–721.

Undoped Epitaxial Si Channel n–MOSFET Grown by UHV–CVD with Preheating, Ohguro et al., IEEE Transactions on Electron Devices, vol. 45, No. 3, Mar. 1998, pp. 710–716.

Two–Dimensional Borderless Contact Pad Technology for a 0.135 $\mu m^2$ 4–Gigabit DRAM Cell, Koga et al., IEEE 1997, pp. 2.1.1–2.1.4.

The Effect of the Elevated Source/Drain Doping Profile on Performance and Reliability of Deep submicron MOSFET's, Sun et la., IEEE Transactions on Electron Devices, vol. 44, No. 9, Sep. 1997, pp. 1491–1498.

Low Resistance Ti or Co Salicided Raised Source/Drain Transistors for Sub–0.13 $\mu$m CMOS Technologies, Chao et al., Proceedings of IEEE Int'l Electron Device Meeting, Jul. 1997, pp. 103–105.

A 0.23 $\mu m^2$ Double Self–Aligned Contact Cell for Gigabit DRAMs with a Ge–Added Vertical Epitaxial Si Pad, Loga et al., IEEE 1996, pp. 22.1.1–22.1.4.

Buried Source and Drain (BSD) Structure for Ultra–Shallow Junction Using Selective Deposition of Highly Doped Amorphous Silicon, Mitani et al., 1996 Symposium on VLSI Technology Digest of Technical Papers, 1996, pp. 176–177.

A Self–Aligned Contact Technology Using Anisotropical Selective Epitaxial Silicon for Giga–Bit DRAMs, Hada et al., IEEE 1995, pp. 27.4.1–27.4.4.

Facet Engineered Elevated Source/Drain by Selective Si Ipitaxy for 0.35 Micron MOSFETs, Maxuré et al., IEEE 1992, pp. 33.7.1–33.7.4.

* cited by examiner

METHOD OF MANUFACTURING A JUNCTION IN A SEMICONDUCTOR DEVICE

BACKGROUND OF THE INVENTION

1. Field of the Invention

The present invention relates to a method of manufacturing a junction in a semiconductor device, and more particularly to a method of manufacturing a junction in a semiconductor device capable of improving a short channel characteristic by suppressing a facet occurred when forming an elevated source/drain junction (ESD) of the buried channel field effect transistors (BC-FETs) using a selective epitaxial growth (SEG) technique as well as capable of increasing the electric current density by lowering the series resistance of source/drain extension.

2. Description of the Prior Arts

Generally, as semiconductor devices become high-integrated, small-sized and high-speed, it is required to improve a short channel characteristic, a junction leakage characteristic and a contact resistance characteristic in the buried channel field effect transistor. The buried channel field effect transistor has been found to show the good improvement in its characteristic when an elevated source/drain junction fabricated by a selective epitaxial growth is applied thereto.

FIGS. 1A to 1C are cross sectional views of the device illustrating a method of manufacturing a conventional semiconductor device.

With reference to FIG. 1A, a device separating film 12 is form on the semiconductor substrate 11 to define an active region, and then a gate oxide film 13, a gate electrode 14 and a mask insulating film 15 are successively formed.

In FIG. 1B, a gate spacer 16 is formed on the side wall of the pattern on which the gate oxide film 13, gate electrode 14 and mask insulating film 15 have successively been deposited, and then a non-doped epi-silicon layer 17 is selectively formed on only an exposed portion of the semiconductor substrate 11 using a chemical vapor deposition (CVD) process. On a portion adjacent the gate side-wall spacer 16 with respect to the epi-silicon layer 17 fabricated by the selective epitaxial growth technique, there occurs a facet 19 having a relatively large angle of 30 to 60°. Herein, prior to growing the epi-silicon layer 17, a native oxide film created on the surface of the semiconductor substrate 11 is removed using a wet cleaning process.

FIG. 1C shows processes for form an elevated source/drain junction. As shown, a source/drain ion implantation process is performed, and then there performed a thermal annealing for activating the ion-implanted dopants. The dopants are diffused into the semiconductor substrate 11 thereby to form a diffusion region 18. As a result, there formed an elevated source/drain junction 178 consisting of the doped epi-silicon layer 17 and the diffusion region 18. In the source/drain ion implantation process, a P-type impurity ion is applied since the buried field effect transistor is P-channel.

In the elevated source/drain junction 178 fabricated by such conventional method, as shown in FIG. 1B, the epi-silicon layer 17 formed using the selective epitaxial growth technique causes a facet 19 to occur on a portion adjacent the gate side-wall spacer 16 with respect to it. Such facet 19 has been disclosed by C. Mazure et al., "IEDM, p853 (1992)". As shown in FIG. 1C, this facet 19 causes a local increase of the depth of the diffusion region 18 formed within the semiconductor substrate 11 beneath the epi-silicon layer 17 upon the source/drain implant. That is, the profile of the diffusion region 18 formed by the source/drain ion implantation process becomes deep in the portion (18A) adjacent the channel, resulting in the increase of the drain induced barrier lowing (DIBL) effect in the elevated source/drain junction 178. As a result, a short channel characteristic becomes worse to the extent that makes an application of the field effect transistor using the buried channel difficult. Such a relationship between the facet 19 and DIBL effect has been discussed by J. J. Sun et al., "IEEE ED-45 [6], p1377 (1998)".

In order to solve the problem due to the facet 19, several improvements have been disclosed by J. J. Sun et al., "IEEE ED-45 [6], p137 (1998)" and C. P. Chao, et at., "IEDM, p103 (1997)". However, these improvements also cause the complexity in other processes. In addition, in order to remove the cause of the local increase of the depth of the diffusion region 18, T. Tanaka et al., "Symp. On VLSI Tech., p88 (1998)" apply a new dopant such as decarborane, $B_{10}H_{14}$.

In the meantime, K. Miyano et al., "Ext. Abst. Of SSDM, p420 (1998)" disclose that a spacer undercut is induced by a negative slope of the side-wall spacer and thus a silicon is somewhat penetrated into the undercut during the selective epitaxial growth (SPG) process. Also, Jung Ho Lee et al., "J. Kor. Phys. Soc., 33 s302 (1998)" discloses that the facet may be minimized by the aid of the stacking fault (SF).

SUMMARY OF THE INVENTION

Therefore, the object of the present invention is to provide a method of manufacturing a junction in a semiconductor device capable of improving a short channel characteristic by suppressing a facet occurred when forming the elevated source/drain junction of the buried channel field effect transistor using a selective epitaxial growth technique as well as capable of increasing an electric current density by lowering the series resistance of source/drain extension.

To accomplish the object, the method in accordance with the present invention comprises the steps of:

successively forming a gate oxide film, a gate electrode and a mask insulating film on the semiconductor substrate;

forming a spacer on side wall of the gate electrode in which the spacer has a double-film structure of an oxide film and a nitride film;

performing a cleaning process for forming an undercut on the spacer and removing a native oxide film created on the surface of the semiconductor substrate;

forming an epi-silicon layer on an exposed portion of the semiconductor substrate so that a stacking fault is formed on a portion adjacent the spacer with respect to the epi-silicon layer and a self-aligned epitaxial silicon sliver is formed on the undercut portion;

performing a source/drain ion implantation process; and performing a thermal annealing for activating the ion-implanted dopants so as to form an elevated source/drain junction.

BRIEF DESCRIPTION OF THE DRAWINGS

The embodiment of the present invention will now be described in more detail with reference to the accompanying drawings in which.

DETAILED DESCRIPTION OF THE INVENTION

Figure 1A:
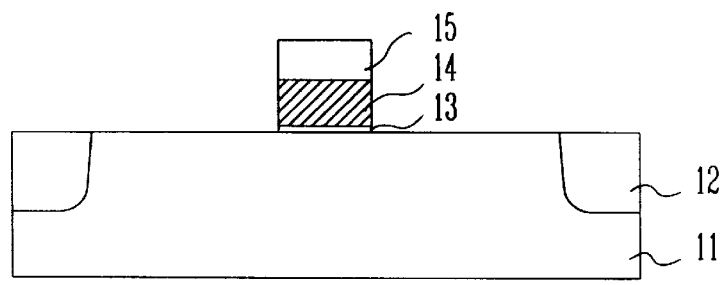
FIGS. 1A to 1C are cross sectional views of the device illustrating a method of manufacturing a junction in a semiconductor device according to the conventional art.
Figure 1B:
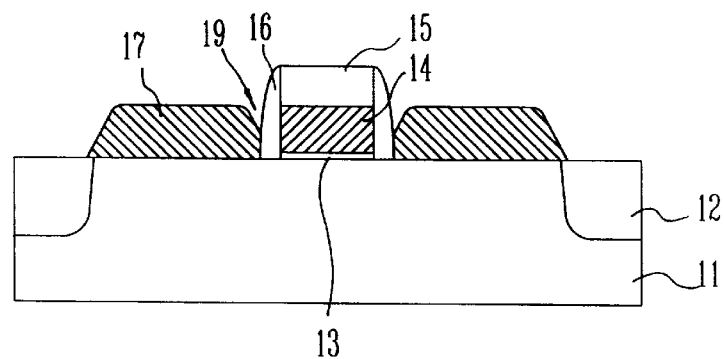
Figure 1C:
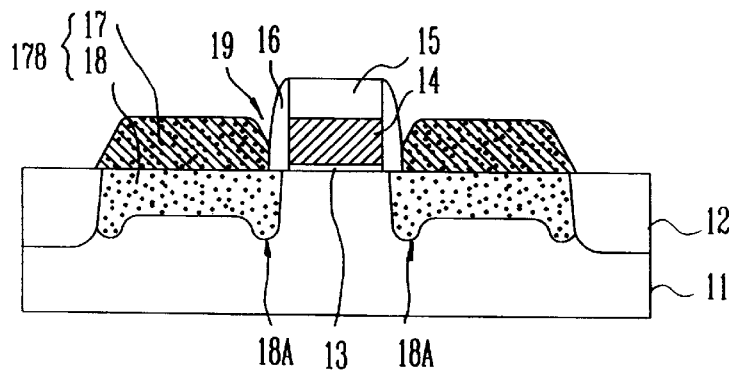
Figure 2A:
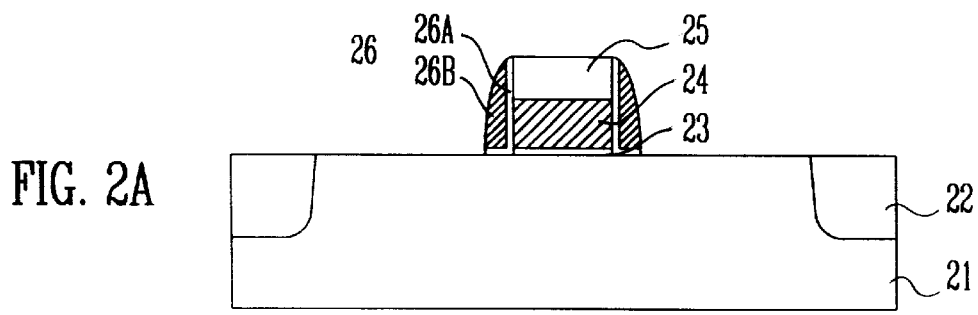
FIGS. 2A to 2D are cross sectional views of the device illustrating a method of manufacturing a junction in a semiconductor device according to the present invention.

With reference to FIG. 2A, a device separating film 22 is formed on the semiconductor substrate 21 so as to define an active region, and a gate oxide film 23, a gate electrode 24 and mask insulating film 25 are successively formed thereon. A gate spacer 26 of a double-film structure having an oxide film 26A and a nitride film 26B is formed on the side-wall of the pattern on which the gate oxide film 23, gate electrode 24 and the mask insulating film 25 have been deposited.

The gate Spacer 26 of the double-film structure is formed by successively depositing the oxide film 26A and the nitride film 26B and then etching the oxide film 26A and the nitride film 26B through a dry etching process. The oxide film 26A is deposited to the thickness of 50 to 150 Å, while the nitride film 26B is deposited to the thickness of 200 to 800 Å through a low pressure chemical vapor deposition (LPCVD) process.

Figure 2B:
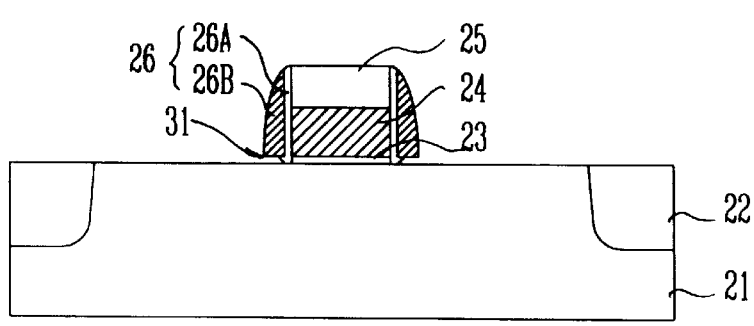

In FIG. 2B, as cleaning processes for removing a native oxide film created on the surface of the semiconductor substrate 21 prior to forming an epi-silicon layer through an subsequent process, an ex-situ cleaning process is performed and then an in-situ process performed within an equipment for forming an epi-silicon layer is followed. As a result, the oxide film 26A beneath the nitride firm 26B constituting a double gate side-wall spacer 16 is removed at a predetermined depth thereby to form an undercut 31.

Herein, the ex-situ cleaning process performed before the formation of the epi-silicon layer carries out a RCA cleaning or the combination of an UV ozone cleaning and a HF dipping. Also, the in-situ process performed within the equipment before the formation of the epi-silicon layer is subjected to a hydrogen baking process at the temperature of 800 to 900° C. during 1 to 5 minutes prior to forming the epi-silicon layer so as to prevent the creation of unwanted oxide layer. The total time required for the cleaning process is controlled so that the undercut of the oxide film 26A beneath the nitride film 26B may be extended into the nitride film 26B to proceed about 100 Å more or less in depth from the oxide layer 23.

Figure 2C:
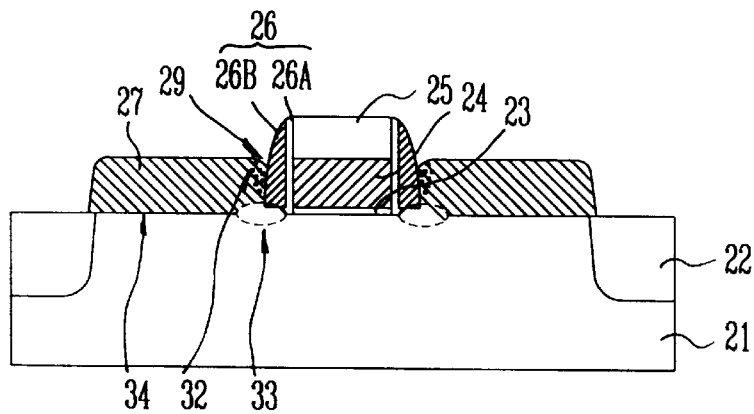

With reference to FIG. 2C, after the completion of the cleaning process, a non-doped epi-silicon layer 27 is selectively formed on only the exposed portion of the semiconductor substrate 21 through the low pressure chemical vapor deposition (LPCVD) or the ultra high vacuum chemical vapor deposition (UHVCVD).

Herein, the epi-silicon layer 27 is formed by a selective epitaxial growth technique, wherein in case of the low pressure chemical vapor deposition, the deposition condition is given as follows. That is, DCS (dichlorosilane: $SiH_2Cl_2$) of 30 to 300 sccm and HCl of 30 to 200 sccm is used as the deposition gas. The deposition pressure is 10 to 50 torr and the deposition temperature is 750 to 950° C. By performing the deposition during 3 to 10 minutes under the deposition condition, the epi-silicon layer 27 of 500 to 2000 Å in thickness is obtained. Also, in case of the ultra high vacuum chemical vapor deposition, the deposition condition is given as follows. That is, silane ($SiH_4$) or disilane ($Si_2H_6$) of about 300 sccm or less is used as the deposition gas and the deposition temperature is 600 to 700° C. By performing the deposition during about 10 minutes under the deposition condition, the epi-silicon layer 27 of 500 to 2000 Å in thickness is obtained.

Although the epi-silicon layer 27 thus formed has a facet 29 occurred in a portion adjacent the gate side-wall spacer 26 with respect to it, the angle of the facet 29 is smaller than that of the facet 19 formed in accordance with the conventional method. The reason is because there formed much stacking fault 31 on the epi-silicon layer 27 adjacent the double gate side-wall spacer 26 under the influence of the undercut during the deposition of the epi-silicon layer 27. In the meantime, when depositing the epi-silicon layer 17, the epi-silicon is deeply encroached into the undercut portion thereby to form a self-aligned epitaxial silicon sliver 33. As a result, an interface 34 between the self-aligned epitaxial silicon sliver 33 formed by the encroachment of the epi-silicon and the semiconductor substrate 21 completely disappears.

Figure 2D:
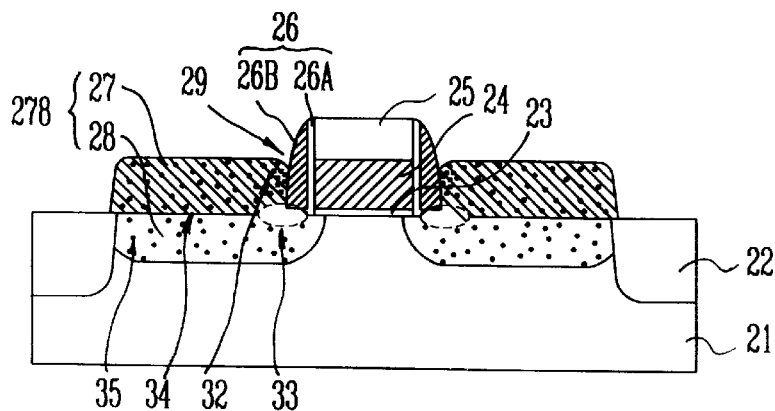

With reference to FIG. 2D, after the completion of the source/drain ion implantation process, a thermal annealing is performed for activating the ion-implanted dopants 35. The dopants 35 are then diffused into the semiconductor substrate 21 to form a diffusion region 28. As a result, a source/drain junction 278 consisting of the doped epi-silicon layer 27 and the diffusion region 28 is formed. The profile of the diffusion region 28 formed by the source/drain ion implantation process has less depth in a portion adjacent the channel with respect to it, compared to the diffusion region 18 formed by the conventional method. The reason is because the formation of the facet 29 is suppressed by the stacking fault 32. Also, as shown in FIG. 2C, since the interface 34 between the self-aligned epitaxial silicon sliver 33 and the semiconductor substrate 21 completely disappears, the dopants 35 can easily be diffused into the source/drain extension region without any segregation phenomenon in the interface 34.

In the source/drain ion implantation process, P-type impurity ion is applied if the buried channel field effect transistor is P-type. In the case that the elevated source/drain junction 278 is $P^+$ source/drain junction, $^{11}B^+$ or $BF_2^+$ is used as a dopant, and the ion implantation energy is set to 5 to 50 KeV in case of $^{11}B^+$ and 10 to 100 KeV in case of $BF_2^+$. At this time, the quantity of the ion implantation is set to $1\times10^{15}$ to $1\times10^{17}$ ions/cm². The thermal annealing for activating the ion-implanted dopants utilizes a furnace annealing or a rapid thermal annealing (RTA). The furnace annealing is performed during 10 to 30 minutes at the temperature of 800 to 950° C. in the $N_2$ atmosphere, while the rapid thermal annealing is performed during 30 seconds or less at the temperature of 900 to 1050° C. in the N₂ or NH₃ atmosphere. At this time, the speed of the rising temperature is set to 30 to 200° C./sec.

In the embodiment described above, when forming the epi-silicon layer 27 using a selective epitaxial growth technique after the formation of the undercut 31 beneath the double gate side-wall spacer 26, the stacking fault 32 is formed by an anisotropic migration characteristic by which silicon atoms are biased to the upper direction rather than the side direction and also the self-aligned epitaxial silicon sliver 33 is formed on the undercut 31 portion. As a result, the stacking fault 32 suppresses the formation of the facet, thereby improving the short channel characteristic and the current density can be increased by increasing the impurity concentration in the source/drain extension by means of the epitaxial silicon sliver 33. Accordingly, the object of the present invention can be achieved.

Figure 3:
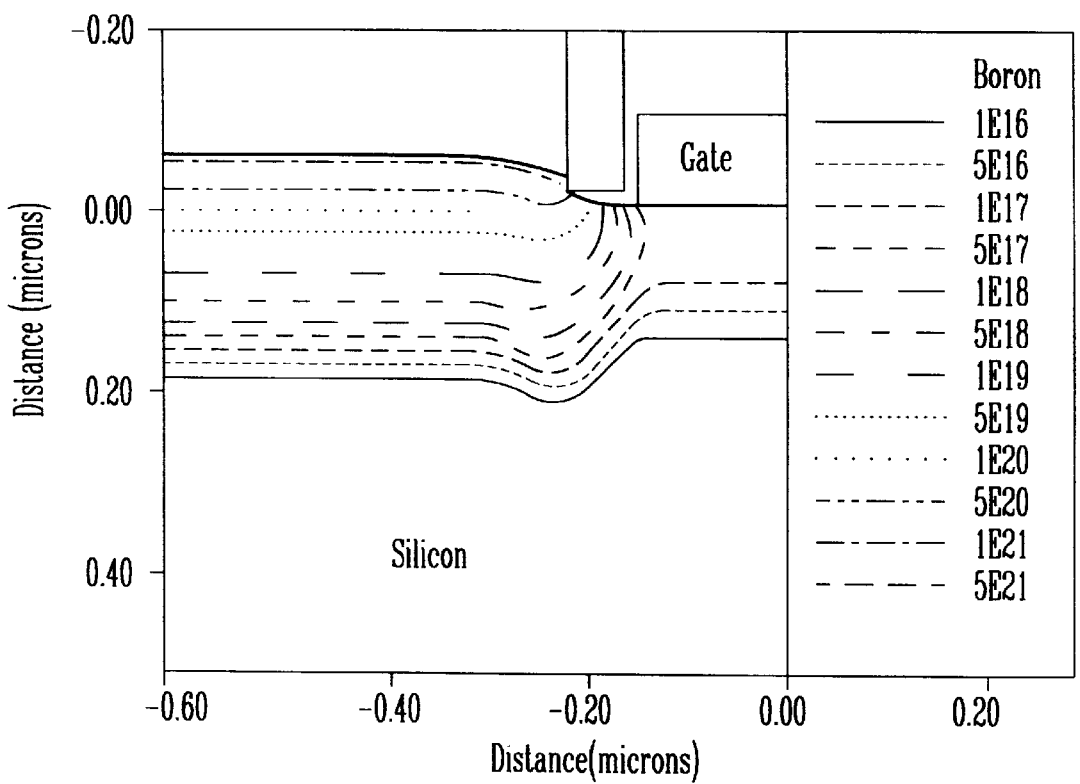
FIG. 3 a simulation view for the profile of the elevated source/drain junction.

FIG. 3 shows a simulation view for the profile of the elevated source/drain junction 178 to which the self-aligned epitaxial silicon sliver (SESS) according to the present invention has been applied. As can be seen, the formation of the facet 29 is suppressed by the stacking fault 32 and thus an unexpected increase phenomenon of the junction depth in the portion adjacent the channel region can remarkably be reduced.

Figure 4:
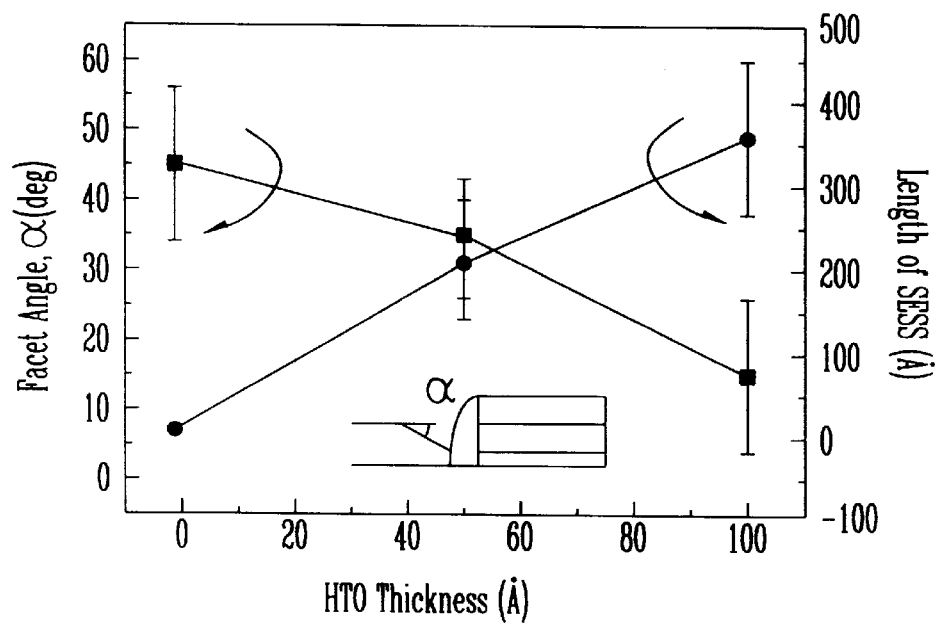
FIG. 4 shows the trade-off relationship between the angle of the facet and the length of the self-aligned epitaxial silicon sliver in connection with the control of the thickness of the oxide film.

FIG. 4 shows a trade-off relationship between the angle of the facet 29 and the length of the self-aligned epitaxial silicon sliver 33 in connection with the control of the thickness of the oxide film 26A constituting the double gate side-wall spacer 26. If the thickness of the oxide film 26A becomes thick, for example, more than 150 Å, it may be advantageous. In this case, however, the self-aligned epitaxial silicon sliver 33 becomes excessively large and too close to the gate oxide film 23, resulting in the deterioration of the GO1 characteristic. On the contrary, if the thickness of the oxide film 26A becomes thin, for example, less than 50 Å, it may also cause the self-aligned epitaxial silicon sliver 33 to be too small, and thus it becomes difficult to obtain the effect of the facet suppression.

Figure 5:
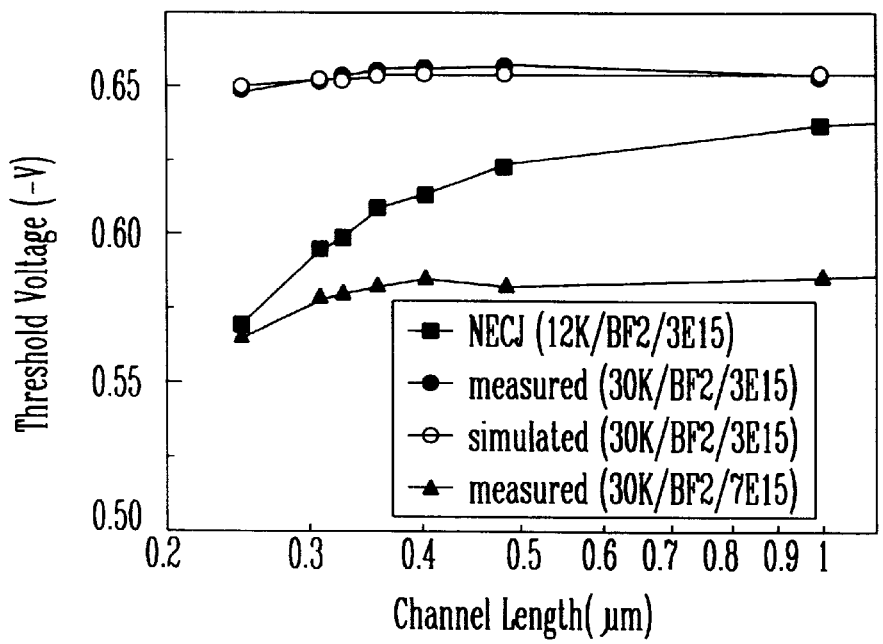
FIG. 5 shows a change in a threshold voltage in accordance with the channel length in the elevated source/drain junction of the present invention and the non-elevated conventional junction.

FIG. 5 shows a change in a threshold voltage in accordance with the channel length in the elevated source/drain junction 278 of the present invention and the non-elevated conventional junction. As can be seen in FIG. 5, a roll-off phenomenon of the threshold voltage in the elevated source/drain junction 278 of the present invention is largely suppressed.

Figure 6:
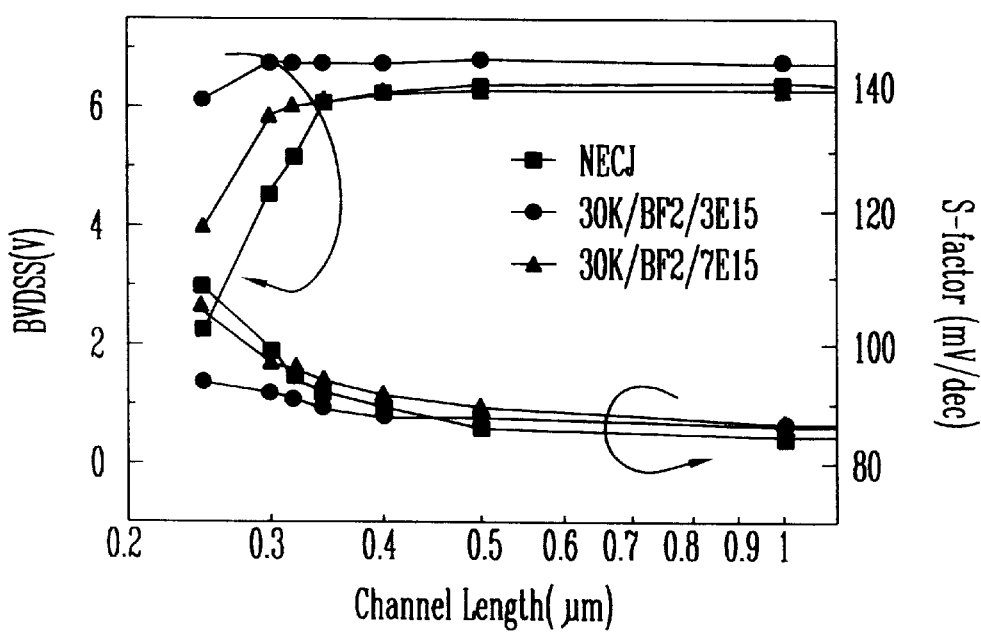
FIG. 6 shows a change in a channel punch through to a swing factor characteristic in accordance with the channel length in the elevated source/drain junction of the present invention and the non-elevated conventional junction.

FIG. 6 shows a change in a channel punch through (BVDSS) to a swing-factor (S-factor) characteristic in accordance with the channel length in the elevated source/drain junction 278 of the present invention and the non-elevated conventional junction (NECJ). In FIG. 6, it can be seen that the channel punch through (BVDSS) to the swing-factor (S-factor) characteristic in the elevated source/drain junction 278 of the present invention is remarkably improved.

Figure 7A:
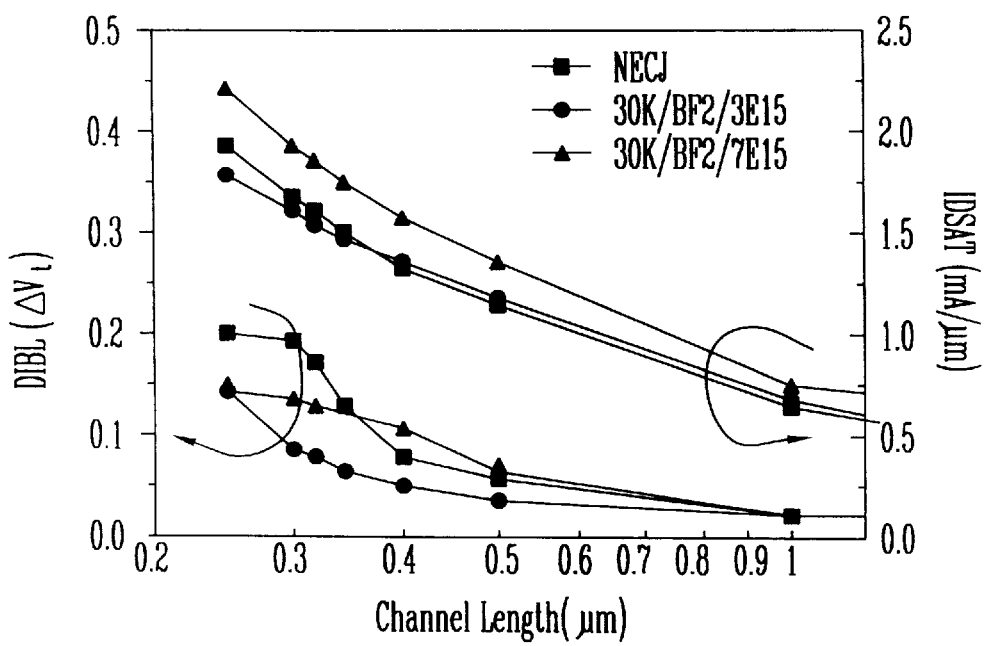
FIG. 7A shows a change in the DIBL effect to a saturation current density in accordance with the channel length in the elevated source/drain junction of the present invention and the non-elevated conventional junction.

FIG. 7A shows a change in the DIBL effect to a saturation current density in accordance with the channel length in the elevated source/drain junction 278 of the present invention and the non-elevated conventional junction. As can be seen, the DIBL effect in the source/drain junction 278 of the present invention is suppressed and the saturation current density is increased. The reason is because the dopant concentration in the source/drain extension region through the self-aligned silicon sliver 33 has been increased.

Figure 7B:
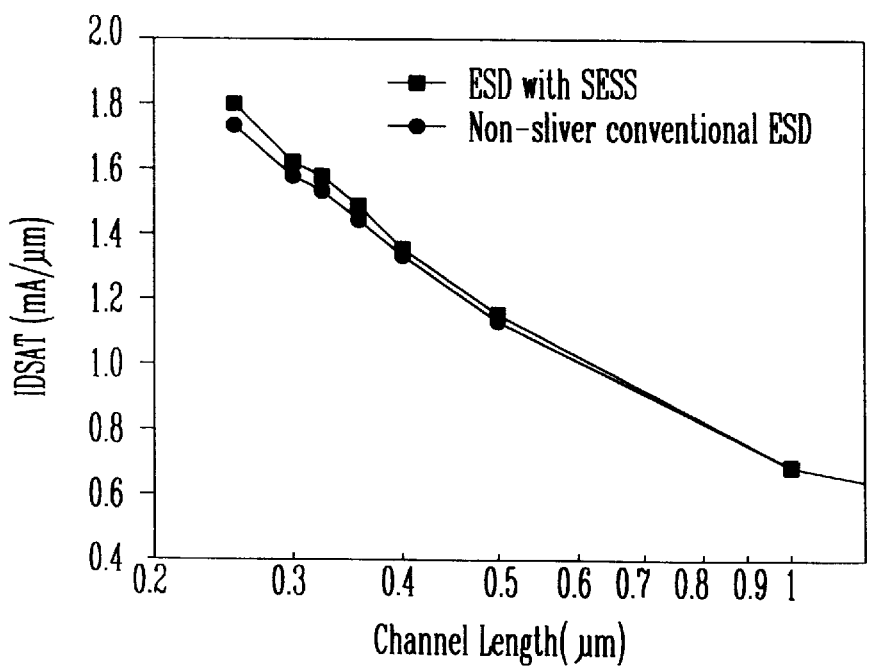
FIG. 7B shows a change in the saturation current density in accordance with the channel length in the elevated source/drain junction of the present invention and the non-elevated conventional junction.

FIG. 7B shows a change in the saturation current density in accordance with the channel length in the elevated source/drain junction 278 of the present invention and the non-elevated conventional junction. In FIG. 7B, it can be seen that the more the saturation current density is close to the short channel in the source/drain junction 278 of the present invention, the more the saturation current density is increased.

As described above, the present invention can improve the short channel characteristic by suppressing a facet occurred when forming the elevated source/drain junction (ESD) of the buried channel field effect transistors (BC-FETs) using the selective epitaxial growth (SEG) technique and can increase the electric current density by lowering the series resistance of source/drain extension.

It is to be understood that the above description is intended to be illustrative, and not restrictive. Many other embodiments will be apparent to those of skill in the art reviewing the above description. The scope of the invention should, therefore, be determined with reference to the appended claims, along with the full scope of equivalents to which such claims are entitled.

What is claimed is:

1. A method of manufacturing a junction in a semiconductor device, comprising the steps of:
   successively forming a gate oxide film, a gate electrode and a mask insulating film on the semiconductor substrate;
   forming a spacer on side wall of said gate electrode in which said spacer has a double-film structure of an oxide film and a nitride film;
   performing a cleaning process for forming an undercut on said spacer and removing a native oxide film created on the surface of the semiconductor substrate;
   forming an epi-silicon layer on an exposed portion of the semiconductor substrate so that a stacking fault is formed on a portion adjacent said spacer with respect to the epi-silicon layer and a self-aligned epitaxial silicon sliver is formed on said undercut portion;
   performing a source/drain ion implantation process; and
   performing a thermal annealing for activating the ion-implanted dopants so as to form an elevated source/drain junction.

2. The method as set forth in claim 1, wherein the spacer is formed by depositing said oxide film to the thickness of 50 to 150 Å and said nitride film to the thickness of 200 to 800 Å and then by etching said oxide film and said nitride film through a dry etching process.

3. The method as set forth in claim 1, wherein said cleaning process consists of an ex-situ cleaning process and an in-situ cleaning process.

4. The method as set forth in claim 3, wherein said ex-situ cleaning process carries out a RCA cleaning.

5. The method as set forth in claim 3, wherein said ex-situ cleaning process carries out the combination of an UV ozone cleaning and a HF dipping.

6. The method as set forth in claim 3, wherein said in-situ process performs a hydrogen baking process at the temperature of 800 to 900° C. during 1 to 5 minutes.

7. The method as set forth in claim 1, wherein said undercut is formed to the depth of about 100 Å more or less from said oxide layer.

8. The method as set forth in claim 1, wherein said epi-silicon layer is formed by a low pressure chemical vapor deposition.

9. The method as set in claim 8, wherein said low pressure chemical vapor deposition uses DCS of 30 to 300 sccm and HCl of 30 to 200 sccm as the deposition gas, the deposition pressure of 10 to 50 torr and the deposition temperature of 750 to 950° C., and forms said epi-silicon layer of 500 to 2000 Å in thickness by performing the deposition during 3 to 10 minutes.

10. The method as set forth in claim 1, wherein said epi-silicon layer is formed by an ultra high vacuum chemical vapor deposition.

11. The method as set in claim 10, wherein said ultra high vacuum chemical vapor deposition uses a silane or disilane of less than about 300 sccm as the deposition gas and the deposition temperature of 600 to 700° C., and forms said epi-silicon layer of 500 to 2000 Å in thickness by performing the deposition during about 10 minutes.

12. The method as set in claim 1, wherein said elevated source/drain junction uses $^{11}B^+$ as a dopant and the ion implantation energy being set to 5 to 50 KeV.

13. The method as set in claim 1, wherein said elevated source/drain junction uses $BF_2^+$ as a dopant and the ion implantation energy is set to 10 to 100 KeV.

14. The method as set in claim 1, wherein said source/drain ion implantation process is set to $1 \times 10^{15}$ to $1 \times 10^{17}$ ions/cm$^2$.

15. The method as set in claim 1, wherein said thermal annealing is a furnace annealing performed during 10 to 30 minutes at the temperature of 800 to 950° C. in the $N_2$ atmosphere.

16. The method as set in claim 1, while said thermal annealing is a rapid thermal annealing performed during 30 seconds or less at the temperature of 900 to 1050° C. in the $N_2$ or $NH_3$ atmosphere.

* * * * *